Figure 1A:
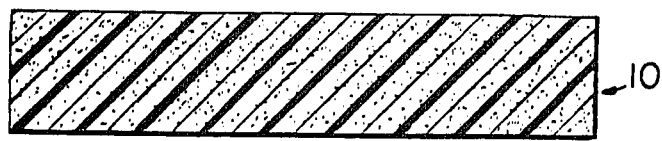

United States Patent [19]
Frisch et al.

[11] 4,424,095
[45] * Jan. 3, 1984

[54] RADIATION STRESS RELIEVING OF POLYMER ARTICLES

[75] Inventors: David C. Frisch, Baldwin; Wilhelm Weber, Hicksville, both of N.Y.

[73] Assignee: Kollmorgen Technologies Corporation, Dallas, Tex.

[*] Notice: The portion of the term of this patent subsequent to Jul. 13, 1999, has been disclaimed.

[21] Appl. No.: 380,999

[22] Filed: May 21, 1982

Related U.S. Application Data

[63] Continuation-in-part of Ser. No. 223,944, Jan. 12, 1981, Pat. No. 4,339,303.

[51] Int. Cl.³ .............. B44C 1/22; C03C 15/00; C03C 25/06; C23F 1/02
[52] U.S. Cl. .............. 156/629; 29/852; 156/83; 156/272.2; 156/280; 156/630; 156/643; 156/645; 156/668; 156/902; 174/68.5; 264/22; 427/45.1; 427/97; 427/307; 428/131; 428/137; 428/901
[58] Field of Search .............. 264/22, 25, 230; 204/159.14, 159.24; 430/313, 314, 315, 318; 174/68.5; 29/847–848, 852; 427/45.1, 54.1, 55, 96, 97, 56.1, 98, 264, 271, 272, 282, 307, 322; 428/131, 137, 901; 156/83, 253, 272.2, 629, 630, 643, 645, 668, 902, 280

[56] References Cited

U.S. PATENT DOCUMENTS

| | | | |
|---|---|---|---|
| 3,515,615 | 6/1970 | Okada et al. | 264/22 X |
| 3,930,963 | 1/1976 | Polichette et al. | 427/97 X |
| 4,163,725 | 8/1979 | Sano et al. | 427/40 X |
| 4,339,303 | 7/1982 | Frisch et al. | 156/668 X |

OTHER PUBLICATIONS

Technology Letter, No. 106, Polysulfones as Printed Circuit Substrates by Union Carbide Corp., Chemical and Plastics Division, May 4, 1977, pp. 1, 3, 5, 7, 8, 10 & 12.
Take a Fresh Look at Plastics for Circuit Boards by G. F. Jacky, Nov. 7, 1975, National Plated Printed Circuits Conference of Sep. 29–30, 1975, pp. 1–19.
Modern Plastics, Jun. 1975, pp. 52–54, New Day Draws for Circuit Boards.
Plastics Engineering, vol. 33, No. 2, Feb. 1977, Polysulfone Coming on Strong for Electrical Applications by R. M. Eichhorn.
Technology Letter, No. 101, Sep. 22, 1976, The Radiation Response of UDEL ® Polysulfone by Union Carbide Corporation.

*Primary Examiner*—William A. Powell
*Attorney, Agent, or Firm*—Morgan, Finnegan, Pine, Foley & Lee

[57] ABSTRACT

A method of rapidly relieving stress in an extruded or molded polymer article is disclosed. The method can be used in the preparation of printed circuit boards. An article comprised of the polymer is exposed to electromagnetic radiation, for a time period sufficient to absorb enough energy to stress relieve the polymer against stress cracking therein. Exposure occurs at one or more ranges of frequencies which are capable of being absorbed by the polymer and which are effective for stress relieving without or substantially without causing heat induced softening or flowing of the polymer. The electromagnetic radiation is selected from the ranges of infrared, microwave or ultraviolet radiation.

34 Claims, 19 Drawing Figures

RADIATION STRESS RELIEVING OF POLYMER ARTICLES

CROSS-REFERENCE TO RELATED APPLICATIONS

This application is a continuation-in-part of application Ser. No. 223,944, filed Jan. 12, 1981, now U.S. Pat. No. 4,339,303.

BACKGROUND OF THE INVENTION

1. Field of the Invention

This invention relates in general to a method of radiation treatment of an article comprised of an extruded or molded polymer, to relieve stress induced in the polymer or to stabilize the polymer against stress cracking. More particularly, the present invention relates to a method of rapidly relieving stress in an article comprised of such a polymer or stabilizing such an article against stress cracking of the polymer in the manufacture of printed circuit boards.

2. Description of the Prior Art

It is well known that a variety of plastics may be electroplated, e.g., for the decorative arts by chemically conditioning them in strong oxidizing acids, e.g., chromic. Among the plastic materials that have been successfully plated are acrylonitrile-butadiene-styrene (ABS) copolymers, polyphenylene oxides (PPO), polysulfones, polyethersulfones, polycarbonates and nylon. Certain of these plastics cannot resist the temperature of soldering, i.e., about 260° C. For example, ABS has a bond strength at room temperature of only 1 newton/mm and a softening temperature of 80° C.–100° C. A printed circuit board made of ABS, consequently cannot withstand soldering temperatures.

The use of thermoplastic polymers as substrate materials for printed wiring boards has had limited application due to marginal chemical compatability of many low cost materials in the pretreatment solutions and plating baths associated with circuit board manufacture. In certain instances where the chemistry of the process is not deemed to be a degrading factor to the plastic, the stringent demands of component assembly and soldering a well as the post soldering flux removal cycles of solvent and/or detergent cleaning have ruled out many contending materials. A suitable thermoplastic should be compatible with circuit board chemistry; machinable on existing equipment; solderable and cleanable; and a suitable dielectric material.

Molded polymers such as sulfone polymers have been used in very limited quantities as printed circuit base material, but only in high frequency applications where the low dielectric constant and dissipation factor of the polymer is required because of the manufacturing difficulties.

A comparison of electrical properties of high temperature thermoplastic polymers such as sulfone polymers to other plastics is shown below:

|  | DIELECTRIC CONSTANT ($10^6 H_z$) | DISSIPATION FACTOR ($10^6 H_z$) | CONTINUOUS USE TEMP. °F. |
|---|---|---|---|
| ABS | 2.4–3.8 | .007–.015 | 180 |
| PPO | 2.6 | .0007 | 220 |
| PAPER REINFORCED EPOXY | 4.0 | .018 | 250 |
| POLYCARBONATE | 2.9 | .010 | 250 |
| GLASS REINFORCED POLYESTER | 4.5 | .020 | 290 |
| GLASS CLOTH REINFORCED EPOXY | 4.5 | .020 | 290 |
| POLYSULFONE | 3.1 | .003 | 345 |
| POLYARYLSULFONE | 3.7 | .006 | 395 |
| POLYPHENYLSULFONE | 3.45 | .0076 | 395 |
| GLASS REINFORCED EPOXY POLYMIDE | 5.1 | .017 | 425 |
| GLASS REINFORCED TEFLON | 2.5 | $8 \times 10^{-4}$ | 500 |

Many extruded or molded high temperature thermoplastic polymer films, sheets or articles require special treatment to relieve stress crazing after being subjected to any mechanical operation. For example, drilling, machining, shearing, trimming, etc., can cause blistering or stress crazing of the polymer material. Presently, the stress relieving of a sulfone polymer, for example, is accomplished by annealing at a temperature of about 167° C. for at least 2 hours. Plating metals onto a sulfone polymer also requires such an annealing step. Similar stress relieving is required for other high temperatures thermoplastics such as polyetherimide, polyetheretherketone and polyphenylsulfone.

Printed circuit base materials consisting of a high temperature thermoplastic polymer such as polysulfone or polyethersulfone have not achieved wide usage because of the extreme processing difficulties and high price of the resin system. Annealing sulfone polymer base material for use as printed circuit substrates, for example, requires one or more annealing steps at a temperature of about 167° C. to stress relieve the sulfone polymer for a minimum of 2–4 hours; 6–8 hours per annealing step is preferred. The sulfone polymer base is fixed between steel supporting plates to maintain its flatness and heated in an oven. The support plates are required to retain the flat shape of the polysulfone base since heating causes softening or flowing of the polysulfone material. The aforementioned laborious annealing steps are required two or more times during the manufacture of printed circuit boards. Failure to relieve stress can result in crazing and cracking of the polymer material in subsequent chemical processing or at a later time.

SUMMARY OF THE INVENTION

1. Objects of the Invention

It is an object of this invention to provide improved methods for stress relieving an extruded or molded polymer article such as an article comprised of a high temperature thermoplastic polymer having an aromatic backbone that does not liquify or decompose at a temperature of about 245° C. after five seconds exposure at that temperature.

Another object of this invention is to provide improved methods for stress relieving articles comprised of an aromatic polyether polymer.

An object of this invention is to provide an improved method for efficiently stress relieving an article comprised of such polymers which avoids annealing the polymer or fixing it between supporting plates to maintain its shape during the stress relieving step, or physical deformation.

Another object of this invention is to provide methods for stress relieving articles comprising a surface layer of the polymers laminated or adhesively attached to a substrate.

An object of this invention is to provide a method for forming an article for adherent metallization which method is more economical and rapid than those of the prior art.

A further object of this invention is to provide an improved method of manufacturing printed circuit boads, including one-layer, two-layer, and multi-layer boards, having high surface resistance, excellent bond strength between the surface of the circuit and the electrolessly deposited metal adhered thereto, excellent stability at soldering temperatures and reproducible and economical methods of manufacture.

Another object of this invention is to provide a method of manufacturing a blank suitable for the preparation of printed circuit boards, the blank comprising a high temperature thermoplastic polymer film, sheet or substrate having a thickness of at least 75 microns.

Additional objects and advantages of the invention will be set forth in the description, or may be realized by practice of the invention, the objects and advantages being realized and attained by means of the methods, processes, instrumentalities and combinations particularly pointed out in the appended claims.

2. Definitions

By the term "aromatic polyether polymer" is meant a thermoplastic polymer characterized by recurring aromatic and ether units in the polymer chain. Representative, but not limiting examples, include sulfone polymers, polyetherimides and polyetheretherketones.

By "sulfone polymer" is meant a thermoplastic polymer containing the sulfone group, O=S=O, including the following polymers: polysulfone, polyethersulfone, polyarylsulfone and polyphenylsulfone.

By the term "high temperature thermoplastic polymer" is meant a polymer having an aromatic backbone that does not liquify or decompose at said temperature. The polymer has a heat deflection temperature of 170° C. or greater.

3. Brief Description of the Invention

To achieve the foregoing objects, and in accordance with its purpose, as embodied and broadly described, the present invention provides a method for stress relieving a polymer article, such as an extruded or molded polymer article. The article may be comprised of a high temperature thermoplastic polymer. The article is exposed to a source of electromagnetic radiation for a time period sufficient to absorb enough energy to stress relieve the polymer against stress cracking therein. Exposure occurs at one or more ranges of frequencies which are capable of being absorbed by the polymer and which are effective for stress relieving without or substantially without causing heat induced softening or flowing of the polymer. Stress cracking in the polymer could result from an extruding, molding or metal plating step or from mechanical treatment or a swelling and etching step as defined subsequently herein. The electromagnetic radiation is selected from the ranges of infrared, microwave and ultraviolet radiation.

As indicated hereinabove, it has been found that stress relieving of polymer by exposing it to such radiation does not produce (and is not dependent on) substantial heat generation. Absent substantial heat generation, the stress relieving method of this invention does not cause the polymer material to soften or flow and thus change its geometric form or dimensions. Since the polymer does not soften or flow during applicants' stress relieving method, the polymer may be stress relieved without the need for supporting fixtures, etc., generally employed in the heat annealing method of stress relieving such polymers.

The present invention also relates to improved methods for the preparation of the following: a blank, a metal clad insulating substrate, a printed circuit board, and printed circuit boards produced by the aforementioned method(s). As subsequently described, certain blanks comprised of the aforementioned polymers are used in the improved methods of this invention for manufacturing circuit boards.

The polymer article may have a thickness at least greater than about 75 microns (3 mils), preferably at least greater than about 775 microns (31 mils), and most preferably at least greater than about 1500 microns (59 mils). The thickness of the polymer substrate is less than about 6250 microns (¼") and preferably less than about 2300 microns (91 mils).

The present invention provides a simple and economical method of preparing an insulating substrate comprised of a high temperature thermoplastic polymer, e.g., an aromatic polyether polymer, having a surface adapted to receive a layer or pattern of conductive metal by electroless deposition techniques. In one aspect, this invention relates to an insulating polymer substrate, suitable for use in printed circuits and the method of its preparation. The method of preparing the polymer insulating substrate or blank for use in the preparation of a printed circuit comprises:

exposing a polymer film, sheet or substrate to electromagnetic radiation at one or more ranges of frequencies which are capable of being absorbed by said film, sheet or substrate and which are effective for stress relieving the polymer essentially without heat induced softening or flowing of the polymer, for a time period sufficient to absorb enough energy to stabilize said film, sheet or substrate against stress cracking of the polymer and relieve stress present therein, the electromagnetic radiation selected from the ranges consisting of microwave, infrared and ultraviolet radiation;

mechanically treating said film, sheet or substrate to produce holes or slots therethrough if not provided previously by a molding process;

repeating the radiation treatment step after mechanical treatment;

chemically treating said film, sheet or substrate with a polar solvent capable of swelling the outer surface of said film, sheet or substrate to promote adhesion of metal to the surface thereof after an etching step; and treating the surface of said film, sheet or substrate in a highly oxidizing solution or with a plasma at a temperature and for a time period sufficient to (produce a hydrophilic surface and thereby) provide sites for chemical and/or mechanical linking of the polymer surface to a metal layer attached thereto.

This invention also includes a method of preparing a composite suitable for use in the manufacture of printed circuit boards which method comprises:

providing the polymer films or sheets having substantially uniform thickness greater than about 75 microns;

laminating the radiation treated polymer film or sheet to a sheet of reinforced thermoset material under conditions of heat and pressure;

mechanically treating the laminate by drilling one or more holes therethrough; and exposing said laminated composite to electromagnetic radiation at one or more ranges of frequencies which are capable of being absorbed by said composite and which are effective in stress relieving essentially without heat induced deformation by softening or flowing of the polymer, for a time period sufficient to absorb enough energy to stress relieve and/or stabilize said polymer against stress cracking.

There is also provided according to this invention a method of preparing a multi-layered printed circuit board, which method comprises the steps of:

providing a substrate having a circuit pattern on at least one surface thereof;

laminating a polymer as described herein having a thickness greater than 75 microns to the metal clad substrate;

mechanically treating the metal clad laminate by drilling one or more holes therethrough;

exposing said polymer to infrared or ultraviolet radiation at one or more ranges of frequencies which are capable of being absorbed by the polymer film or sheet and which are effective for stress relieving essentially without heat induced deformation by softening or flowing of the polymer, for a time period sufficient to stress relieve and/or stabilize the polymer film or sheet against stress cracking;

chemically treating the polymer surface with a solvent and oxidizing agent to render said surface microporous and hydrophilic;

repeating the radiation treatment step with infrared or ultraviolet radiation for a time period sufficient to stabilize the polymer against stress cracking; and electrolessly depositing a metal onto the treated surface.

Aromatic polyether polymers, such as sulfone polymers, are high temperature thermoplastic polymers which have an aromatic backbone and do not liquify or decompose at a temperature of about 245° C. after five second exposure at such a temperature. Preferred sulfone polymers according to this invention are polysulfone, polyethersulfone, polyether ether sulfone, polyarylsulfones and polyphenylsulfone.

Polysulfone has the following recurring unit:

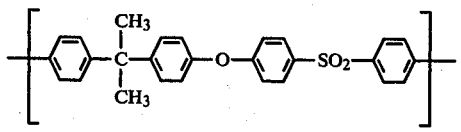

Polyethersulfone has the following recurring unit:

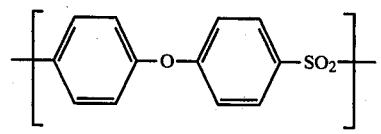

As can be seen in the structural formulas set forth hereinabove, recurring aromatic and ether units appear in the polymer chain.

These aromatic polyether polymers in molded sheets, rods and/or film forms can be treated to render the surfaces of these materials receptive to adherent metal deposition. Sulfone polymers have been used widely in the decorative, automotive, electronic component, medical appliance, food processing and dairy equipment industries. For illustrative purposes, the following discussion will be directed to certain polysulfones (commercially available as UDEL polysulfone from Union Carbide Corporation, 270 Park Avenue, New York, N.Y. 10017). It is known that polysulfones are characterized by toughness, low creep, and long term thermal and hydrolytic stability, including years of continuous service in boiling water of steam, and in air in excess of 150° C., with little change in properties. Polysulfones qualify for Underwriters' Laboratories Thermal Index ratings of 150° C; they maintain their properties over a temperature range from −100° C. to above 150° C. They have a heat deflection temperature of about 174° C. at 264 psi (1.8 MPa) and about 181° C. at 6 psi (41 KPa). Long term thermal aging at 150°–200° C. has little effect on the physical or electrical properties of sulfone polymers.

Polysulfone may be prepared by the nucleophilic substitution reaction between the sodium salt of 2,2-bis (4-hydroxyphenyl)propane and 4,4'-dichlorodiphenyl sulfone. The sodium phenoxide end groups are reacted with methyl chloride to terminate the polymerization. This controls the molecular weight of the polymer and contributes to thermal stability.

The chemical structure of polysulfone is characterized by the diaryl sulfone grouping. This is a highly resonating structure, in which the sulfone group tends to draw electrons from the phenyl rings. The resonance is enhanced by having oxygen atoms para to the sulfone group. Having electrons tied up in resonance imparts excellent oxidation resistance to polysulfones. Also, the sulfur atom is in its highest state of oxidation. The high degree of resonance has two additional effects: it increases the strength of the bonds involved and fixes this grouping spatially into a planar configuration. This provides rigidity to the polymer chain, which is retained at high temperatures.

The ether linkage imparts some flexibility to the polymer chain, giving inherent toughness to the material. The sulfone and ether linkages connecting the benzene rings are hydrolytically stable. Therefore, as indicated previously hereinabove, polysulfones are resistant to hydrolysis and to aqueous acid and alkaline environments.

Suitable polysulfone polymers according to the present invention include commercially available polysulfones such as an unfilled grade of polysulfone (the P-1700 series) which is used for injection molding or extrusion; a higher molecular weight series for extrusion applications (such as the P-3500 series); and a mineral filled polysulfone useful for plating applications (such as the P-6050 series) (the P-1700, P-3500 and P-6050 series all being polysulfones commercially available under the tradename UDEL from Union Carbide Corporation, 270 Park Avenue, New York, N.Y. 10017). Also suitable is a polyphenyl sulfone (commercially available under the tradename RADEL from Union Carbide Corporation, 270 Park Avenue, New York, N.Y. 10017).

In addition to the polysulfone polymers, other aromatic polyether polymers are suitable for purposes of this invention and are within the scope thereof. For example, a commercially available polyetherimide (sold under the trademark ULTEM from General Electric, One Plastics Avenue, Pittsfield, MA) and a commercially available polyetheretherketone (sold under the tradename PEEK by ICI America, Inc.) are suitable employable aromatic polyether polymers within the purview of this invention.

The film surface(s) of the polymers of this invention have a substantially uniform thickness and can be chemically treated by techniques known in the art to achieve excellent adhesion of subsequent deposits of electroless metal during the manufacture of printed circuit boards.

It is generally known that these high temperature polymer films require prolonged annealing bakes to prevent stress cracking. For example, it is well known that polysulfone type materials having a thickness greater than about 1500 microns require annealing prior to any mechanical fabrication steps such as drilling or punching, involved in preparing a printed circuit board. Moreover, the aromatic polyether type materials require annealing after the mechanical features have been put in the board, prior to electroless metal depositions, in order to prevent stress cracking in a solvent swell solution and oxidation solution. Typical recommendations for annealing conditions are two to four hours and up to nine hours at 170° C. to 205° C. between plates or molds to maintain shape of flatness prior to processing. As indicated hereinabove, an additional extended annealing cycle is required after machining the material prior to etching the surface for subsequent metal depositions. The advantages of using rapid molded aromatic polyethers are very important to those users who have stringent electrical requirements at high frequency applications. In such cases, the material is ideally suited but requires that the laborious annealing steps be performed in order to render these materials processable. However, as described herein, stress relieving by radiation treatment and production of the blank and/or laminate of this invention occur simultaneously in one step. It has been discovered that the aforestated polymer films, sheets, composites and circuit boards of this invention could be stress relieved or stabilized against stress cracking in the order of minutes or less by exposure to preselected ranges of frrquencies of electromagnetic waves. This discovery eliminates the need for the previously mentioned laborious and time consuming secondary annealing steps of the prior art.

The present invention is based upon the discovery that extruded or molded polymer articles/materials such as high temperature thermoplastic polymer materials can be stress relieved or stabilized against stress cracking in a short period of time without including any distortion or stresses into the material. This is accomplished by exposing for a relatively short period of time, the polymer material to one or more microwave, ultraviolet or infrared frequencies capable of being absorbed by the polymer and which are effective for stress relieving essentially without causing heat induced softening or flowing of the polymer. The microwave, ultraviolet or infrared radiation treated polymer material is stress relieved and/or stabilized against stress cracking so that it can be drilled or subsequently placed in the various oxidizing and swelling solutions without stress cracking. Moreover, in addition to rapidly stress relieving or stabilizing a polymer against stress cracking, another advantage of this invention is that the danger of article deformation is substantially eliminated.

According to one aspect of this invention, an article comprised of an aromatic polyether polymer is exposed to microwave frequencies above 2400 Megahertz, preferably between $10^8$ and $10^{16}$ Hertz, in a microwave oven chamber to stress relieve the article. This discovery is quite surprising since it has been reported in the literature that polysulfone for example is largely unaffected by such radiation. Unlike prior art methods, the microwave treatment cycle reduces heat distortion and has been found to eliminate the need for fixturization of the materials between metal plates used when heat annealing. The microwave treatment step is quite short, between 1 and 60 minutes, typically is on the order of thirty (30) minutes (for 1.6 mm thick material), and varies according to the material thickness. After treatment in a microwave oven, the stress relieved polymer materials may be fabricated and in the case of printed circuit board manufacture, processed through the drilling or punching prefabrication hole formation operations formations sequence.

The methods of this invention may also use microwave frequencies to achieve the same result as a second annealing bake, which is typically recommended in prior art methods. The fabricated part may be stress relieved by exposure to microwave frequencies for a suitable time period, e.g., thirty (30) minutes (1.6 mm thick), varying again according to the material thickness. The steps of the methods of this invention eliminate the protracted bake cycles of the prior art methods previously described while rendering the polymer part dimensionally stable and resistant to subsequent chemical and metalizing operations.

In another aspect of this invention, an infrared radiation system, such as, e.g., the one employed for curing masking inks used in the manufacture of printed circuit boards, may be used to stress relieve polymer materials.

The polymer may be exposed to infrared radiation in a conveyorized infrared oven. Unlike prior art annealing methods, the infrared treatment cycle reduces heat distortion and has been found to eliminate the need for fixturization of the materials between metal plates used when heat annealing. The infrared treatment step is effected by exposing the polymer material to infrared radiation having a wavelength between about 2.5 and 50 $\mu$m, preferably between about 6 and about 20 $\mu$m (micrometers), for a time period of at least about 35 seconds (for 1.6 mm thick material). The time period varies according to the thickness of the polymer material, longer times being required for thicker materials. Infrared treatment may be used for each stress relieving or stabilization step required in place of prior art bake cycles in the use of polymer materials.

In still another aspect of this invention, an ultraviolet source may be used to treat the polymer. Sulfone polymers such as polysulfone are known to be totally absorbent in the ultraviolet portion of the spectrum, i.e., at 0.2 to 0.38 $\mu$m. However, applicants have discovered that ultraviolet stress relieving or stabilization of a sulfone polymer against stress cracking takes place only within the narrow band between 0.23 and 0.28 μm of the ultraviolet spectrum after exposure of the sulfone polymer for a time period varying according to the material thickness. Other ultraviolet wavelengths outside this band, e.g., 0.32 μm, do not stress relieve or stabilize a sulfone polymer against stress cracking. The ultraviolet radiation treated sulfone polymer may be fabricated and processed as described previously herein with respect to microwave or infrared radiation treated sulfone polymer(s).

While radiation treatment of high temperature thermoplastic polymer articles generally may be interchangeably accomplished by infrared, microwave or ultraviolet radiation according to this invention, there are exceptions. For example, in the case of a copper clad polysulfone article, it has been found that stress relieving or stabilization of the polysulfone against stress cracking can be accomplished by infrared or ultraviolet radiation but not with microwave radiation. Microwave radiation of copper clad articles produces excessive heat in the copper layer, thus not only causing field distortions and overload conditions, but at the same time damaging the polysulfone.

In one method of producing printed circuit boards, the so-called "semi-additive" technique is employed. The insulating blank of this invention is cut to size and exposed to microwave, infrared or ultraviolet radiation at a frequency capable of being absorbed by the polymer. Then the holes are prepared therein by drilling, punching or the like. Alternately, the blank may be molded with holes therein. Such a molded blank does not require a subsequent mechanical hole production step and eliminates the need for the stress relieving radiation step before such mechanical treatment step. After the holes are prepared, the blank is exposed to microwave, infrared or ultraviolet radiaiton at a frequency capable of being absorbed by the polymer for a time period sufficient to absorb enough energy to stress relieve the polymer. A blank according to present invention is pretreated for about three to six minutes in a dimethyl formamide solution to promote adhesion of metal to the surface of the blank after an etching step. The blank is then etched for about three minutes at about 55° C. to 65° C. in a highly oxidizing solution. This changes the surface of the blank from glossy to hazy while providing sites for chemical linking of the surface of the blank to metal. Effective etching occurs due to the combination of the liquid pretreatment and the oxidizer contacting the surface(s) of the blank of this invention. With dimethyl formamide solution, a low chromic acid may be used. Alternately, if a treatment with a low chromic acid solution or a chrome free acid solution is used prior to the etching, a high chromic acid solution may be effectively utilized. The etched and pretreated blank is activiated by immersion in a catalytic solution stannous-palladium-chloride solution at ambient temperature for 1-3 minutes. During such immersion, palladium catalytic sites are deposited over the entire blank including on the walls of holes in the blank in order to catalyze the subsequent deposition of electroless metal.

A thin layer of metal is then electrolessly deposited on the surface and on the hole walls of the blank typically at ambient temperature or about 52° C. (about 30° C. for nickel) for about 30 minutes for sufficient metal deposition to make the surface of the blank conductive. Following this step, the metal coated board may be imprinted with a desired circuit by a photoresist technique. According to the photoresist technique, a photosensitive coating is applied to the surface of the blank. The pohotsensitive coating may be of the type that polymerizes or depolymerizes on exposure to ultraviolet light. A positive or negative transparency, respectively of the circuit, is then used to form a background resist which in turn outlines a circuit pattern on the blank. Alternatively, a temporary protective composition forming a plating resist may be employed to silk screen print the negative of the desired circuit pattern. The temporary resist may be heat cured. Copper or another electroconductive metal is electroplated onto the pattern to a desired thickness such as 1-5 mils in about 1½ hours. The pattern may then be solder plated, if desired. The temporary photoresist, if any, may be removed and the thin layer of electroless metal which had been covered by it is etched away. Contact areas such as edge connectors may be electroplated with noble metals such as gold, silver, etc.

The acid conditioner typically used for etching acrylonitrile-butadiene-styrene substrates is satisfactory for the hereindisclosed polymer substrates. A typical composition of this acid on a weight basis: 60% $H_2SO_4$, 10% $H_3PO_4$, 1% $CrO_3$, and 30% $H_2O$. During etching, the chromium that comes in contact with the pretreated polymer surface is reduced from $Cr^{+6}$ to $Cr^{+3}$. When most of the chromium is reduced, the acid is no longer as effective in improving adhesion of metal coatings. For this reason, it is desirable to have as much chromium in the acid conditioner as possible. However, with dimethyl formamide as the preconditioner bath, chromic acid contents above about 3% may result in macro-crazing and poor adhesion. A preferred acid conditioner for the polymer surface(s) is, therefore, (on a weight basis): 55.9% of 96% $H_2SO_4$, 10.4% of 85-87% $H_3PO_4$, 3% of $CrO_3$ and 30.7% of $H_2O$.

In another method of producing printed circuit boards, the so-called "fully additive" technique is employed. A suitable insulating blank according to the present invention is prepared comprised of an aromatic polyether material. Holes with a distance between centers of about 2.5 mm or less typically are formed in the blank at preselected sites. Before the holes are made, the blank is exposed to microwave, infrared or ultraviolet radiation at one or more ranges of frequencies capable of being absorbed by the polymer and which are effective for stress relieving essentially without causing heat induced softening or flowing thereof for a time period sufficient to absorb enough energy to effect stress relieving or stabilization against stress cracking therein. The blank and walls of the holes are surface pretreated by etching with a conventional chrome acid oxidizing solution to prepare the surface of the blank and the walls of the holes chemically and physically. A photoimaging technique described in U.S. Pat. Nos. 3,772,078; 3,907,621; 3,925,578; 3,930,962; and 3,994,727, all to Polichette et al., incorporated herein by reference, is then employed. The blanks and holes are completely coated with an aqueous ultraviolet light reducible, copper complex and dried. An ultraviolet light photoimage is formed by projection or contact printing on the sensitized substrate. The unexposed light reducible coating is washed off and the image is fixed by brief exposure to an electroless copper bath to provide a permanent background resist leaving the desired circuit pattern exposed, the pattern having as low as about 0.2 mm between lines.

A metal such as copper is electrolessly deposited onto the exposed pattern and in the holes until a circuit is built up to the desired thickness, e.g., about 1–5 mils (25–125 microns). In another method, the blank of this invention is provided with a metal layer, e.g., a copper layer by electroless deposition followed by electroplating a thicker metal layer to form a printed circuit pattern of the desired thickness. The circuit is protected from corrosion by coating it with rosin lacquer or solder coating the blank.

In an alternative "fully additive" technique for producing printed circuit boards, a suitable blank according to the present invention is prepared typically having a distance between hole centers of about 2.5 mm or less. After the holes were made, the blank is exposed to electromagnetic radiation to stress relieve or stabilize the polymer against stress cracking as described previously herein. For example, the blank prepared from a sulfone polymer may be exposed to ultraviolet radiation at a wavelength between 230 and 270 nm for a time period of about 15–20 minutes. The blank and walls of the holes are activated using known seeding and sensitizing agents such as stannous chloride-palladium chloride, activators, a permanent protective coating or resist is screened to produce a permanent background resist leaving the desired circuit pattern exposed, the pattern having spacing as low as about 0.35 mm between conductor lines. The resist is cured and copper is electrolessly deposited on the exposed pattern and in the holes.

The blank according to the present invention may alternately be catalytic, i.e., having catalytic materials distributed throughout its surface during extrusion of the thermoplastic film surface of the blank. In the aforementioned techniques for manufacturing printed circuit boards, this would eliminate the need for a separate seeding and sensitizing step. Incorporation of catalytic materials into the surface of the thermoplastic film may be accomplished by the technique disclosed in U.S. Pat. Nos. 3,546,009; 3,560,257; 3,600,330 and example 1 of U.S. Pat. No. 3,779,758 (a palladium chloride).

Materials which preferably are used to comprise the blanks and/or laminates of this invention are the polymers as herein defined.

In an embodiment of the invention, materials which may comprise the insulating substrates of the laminates of this invention are inorganic and organic substances, such as glass, ceramics, porcelain, resins, paper, cloth and the like. For printed circuits, materials used as the insulating substrates for the laminates include insulating thermosetting resins, thermoplastic resins and mixtures of the foregoing, including fiber, e.g., fiberglass, impregnated embodiments of the foregoing.

Included in the thermoplastic resins are cellulosic resins, such as cellulose triacetate, and polycarbonates, polychlorotrifluoroethylene, polyesters and polyimides.

Among the thermosetting resins are allyl phthalate; furane, melamine-formaldehyde; phenol formaldehyde and phenolfurfural copolymers, alone or compounded with butadiene acrylonitrile copolymers or acrylonitrile-butadiene-styrene copolymers; polyacrylic esters; silicones; urea formaldehydes; epoxy resins, allyl resins; glyceryl phthalates; polyesters; and the like.

Porous materials, comprising paper, wood, fiberglass, cloth and fibers, such as natural and synthetic fibers, e.g., cotton fibers, polyester fibers, and the like, as well as such materials themselves, may also be metallized in accordance with the teachings herein. The invention is particularly applicable to the metallization of blanks having a surface comprised of a high temperature polymer and optionally also having an underlying insulating substrate in registration therewith comprised of resin impregnated fibrous structures and varnish coated resin impregnated fiber structures of the type described.

The laminates may comprise any insulating material coated with the polymer film form, regardless of shape or thickness, and includes thin films and strips as well as thick substrata. The laminates can include metals such as aluminum or steel which are coated with insulating layers of polymers. Where the conductive pattern is only to be on upper and lower surfaces, the substrate of the laminate may optionally be coated with extruded polymer films. If the conductive pattern is to include plated through holes, it may be preferable to first provide the metal blanks with holes and coat the insulating surfaces on the laminate by fusing techniques such as fluidized bed.

Typically, the autocatalytic or electroless metal deposition solutions for use in depositing electroless metal on the activated polymer surface(s) of the blanks comprise an aqueous solution of a water soluble salt of the metal or metals to be deposited, a reducing agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, nickel, cobalt, silver, gold solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g. tetrasodium ethylenediamine-tetraacetic acid, and a pH adjustor, e.g., sodium hydroxide.

Typical electroless nickel baths which may be used are described in Brenner, Metal Finishing, Nov. 1954, pages 68 to 76, incorporated herein by reference. They comprised aqueous solutions of a nickel salt, such as nickel chloride, an active chemical reducing agent for the nickel salt, such as hypophosphite ion, and a complexing agent, such as carboxylic acids and salts thereof.

Electroless gold plating baths which may be used are disclosed in U.S. Pat. No. 3,589,916, incorporated herein by reference. They contain an aqueous alkaline solution of a water soluble salt of gold, a borohydride or amine borane reducing agent, a complexing agent for gold and a small, effective stabilizing amount of cyanide compound in an amount between about 5 micrograms and 500 milligrams. The pH of the bath will be between about 10 and 14.

Typical electroless cobalt and electroless silver systems are well known.

A specific example of an electroless copper deposition bath suitable for use will now be described:

| | |
|---|---|
| N,N,N'—N' tetrakis (2-hydroxy-propyl ethylenediamine) | 18 g./l. |
| $CuSO_4$—$5H_2O$ | 10 g./l. |
| Formaldehyde (37% solution) | 4 ml./l. |
| Wetting agent (GAFAC-RE 610) | 0.01 g./l. |

| | |
|---|---|
| (commercially available from GAF Corporation) (believed to be a phosphate ester of alkyl-phenolpolyethylene oxide) | |
| Sodium hydroxide | to desired pH (12–13) |
| Sodium cyanide (NaCN) | 25 mg./l. |
| 2-mercapto benzothiazole | 10 ug./l |

This bath is preferably operated at a temperature of about 52° C., and will deposit a coating of ductile electroless copper about 35 microns thick in about 18 hours.

Utilizing the electroless metal baths of the type described, very thin conducting metal films or layers will be laid down on the surface of the polymer blank. Ordinarily, the metal films superimposed on the surface of the polymer blank by electroless metal deposition will range from 2.5 to 100 microns in thickness, with metal films having a thickness of even less than 2.5 microns being a distinct possibility.

Among its embodiments, the present invention contemplates metallized blanks in which the electroless metal, e.g., copper, nickel, gold or the like, has been further built up by attaching an electrode to the electroless metal surface and electrolytically, i.e., galvanically depositing on it more of the same or different metal, e.g., copper, nickel, silver, gold, rhodium, tin, alloys thereof, and the like. Electroplating procedures are conventional and well-known to those skilled in the art.

For example, a copper pyrophosphate bath is commercially available for operation at a pH of 8.1 to 8.5, a temperature of 50° C., and a current density of 50 amp./sq. ft. In addition, a suitable acid copper sulfate bath is operated at a pH of 0.6 to 1.2, a temperature of 15°–50° C., and a current density of 25 to 70 amp. per sq. ft. and is comprised of:

| | |
|---|---|
| copper sulfate, $CuSO_4—5H_2O$ | 60–120 g./l. |
| sulfuric acid, $H_2SO_4$ | 160–180 g./l. |
| hydrochloric acid, HCl | 50–100 mg./l. |
| brighteners and wetting agents | optional |

For printed circuit application, copper deposits for use as the basic conductor material are usually 25 um to 70 um thick.

Gold may be deposited galvanically from an acid gold citrate bath at pH 5–7, a temperature of 45°–60° C. and a current density of 5–15 amp./sq. ft. An illustrative galvanic gold bath consists of:

| | |
|---|---|
| Sodium gold cyanide, $NaAu(CN)_2$ | 20–30 g./l. |
| dibasic ammonium citrate $((NH_4)_2C_6H_5O_7)$ | 100 g./l. |

Nickel can be galvanically deposited at pH 4.5 to 5.5, a temperature of 45° C., and a current density of 20 to 65 amp./sq. ft., the bath containing:

| | |
|---|---|
| nickel sulfate, $NiSO_4\ 6H_2O$ | 240 g./l. |
| nickel chloride, $NiCl_2\ 6H_2O$ | 45 g./l. |
| boric acid, $H_3BO_3$ | 30 g./l. |

Tin and rhodium alloys can be galvanically deposited by procedures described in Schlabach et al., Printed and Integrated Circuitry, McGraw-Hill, New York, 1963, p. 146–148.

Other objects and advantages of the invention will be set forth in part herein and in part will be obvious herefrom or may be learned by practice with the invention, the same being realized and attained by means of the instrumentalities and combinations pointed out in the appended claims.

The invention is more fully described hereinafter with reference to the accompanying drawings which illustrate certain embodiments of the invention and together with the specification serve to explain the principles of the invention.

FIG. 1-3 illustrate procedures which can be used to produce printed circuit boards from insulating blanks produced in accordance with the teachings herein.

In the drawings, similar reference numerals are used to represent similar parts.

Figure 1B:
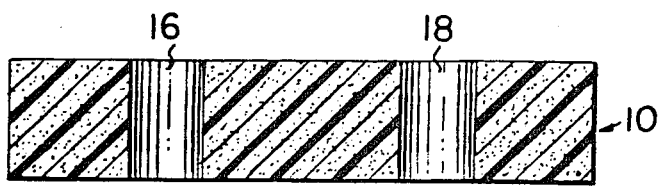
Figure 1C:
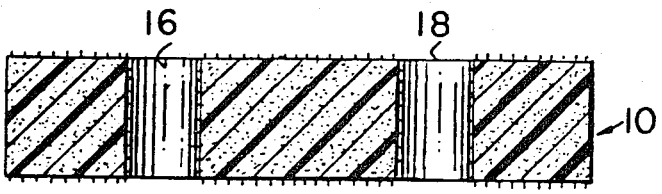
Figure 1D:
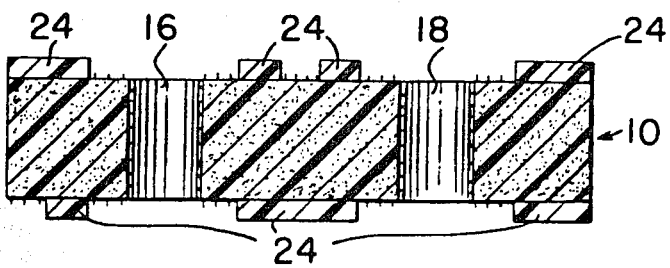
Figure 1E:
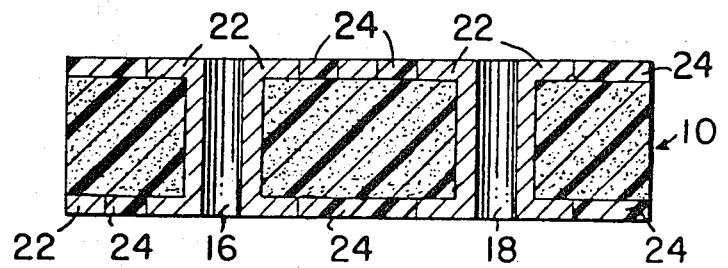
Figure 1F:
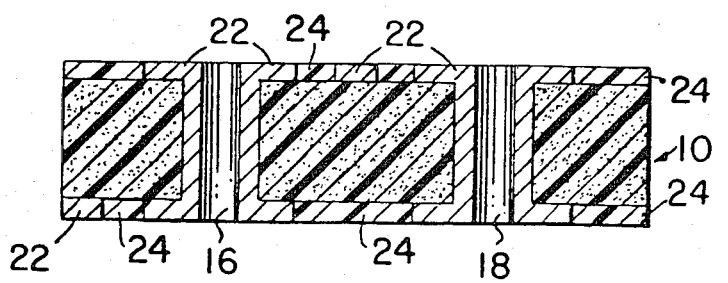
Figure 1G:
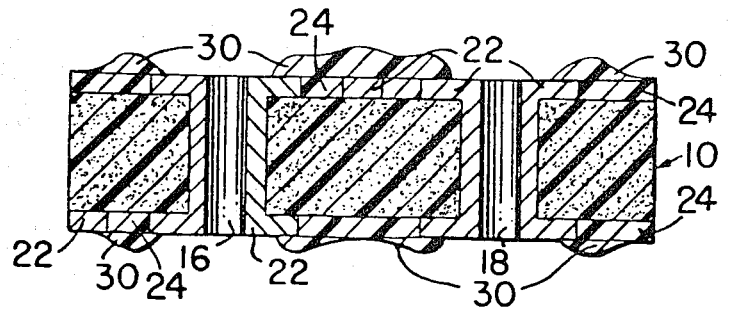

Referring to FIG. 1A, there is shown an insulating catalytic blank 10 according to the present invention. The blank comprises an aromatic polyether polymer such as a polysulfone, a polyetheramide or a polyetheretherketone. In this illustration, a sulfone polymer is employed. The sulfone polymer blank 10 is catalytic for electroless deposition. Prior to drilling, the blank 10 is exposed to microwave radiation at a frequency above 1960 MHz (1.96 GHz) for about 30 minutes to stabilize the blank 10 against stress. In FIG. 1B holes 16 and 18 are drilled through the blank 10. After the holes were made, the blank is exposed to microwave radiation at a frequency greater than about 1960 megahertz (1.96 GHz) for up to about 30 minutes. The blank 10 is them immersed in a pre-etch solvent followed by a chemical treatment with an acid etch such as 20 g./l. $CrO_3$, 500 mg./l. $H_2SO_4$, 25 g./l. NaF at a temperature between 45° and 65° C. to expose the catalyst and activate the surface of the blank 10 as shown in FIG. 1C. A permanent photoresist 24 is applied (shown in FIG. 1D) on a surface of the blank to mask areas that will not be subsequently copper plated. Copper is then electrolessly deposited, by methods known in the art through the holes 16 and 18 and onto the exposed surfaces of the blank 10 to form a copper conductive pattern 22 about 35 microns thick on the exposed surface of the blank and on the walls of the holes 16 and 18 as shown in FIG. 1E. A registered solder mask 30 then may be applied over the circuit pattern leaving holes 16 and 18 exposed (FIG. 1G).

FIG. 2 illustrates a fully additive method of producing a printed circuit board. Referring to FIG. 2A, there is shown an insulating blank 10 comprised of a sulfone polymer sheet.

Figure 2A:
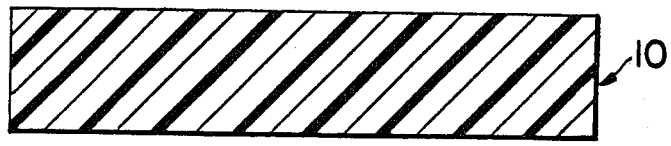
Figure 2B:
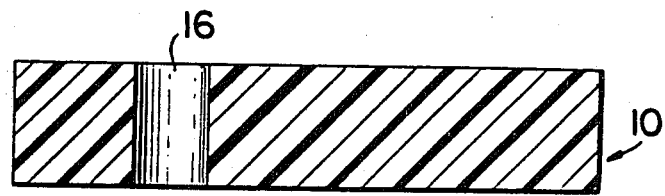
Figure 2C:
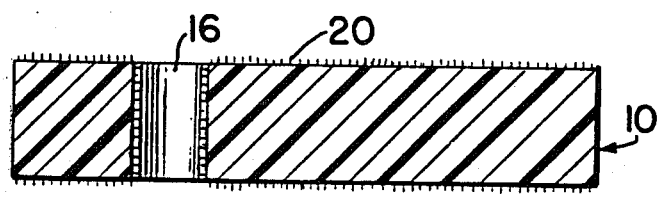
Figure 2D:
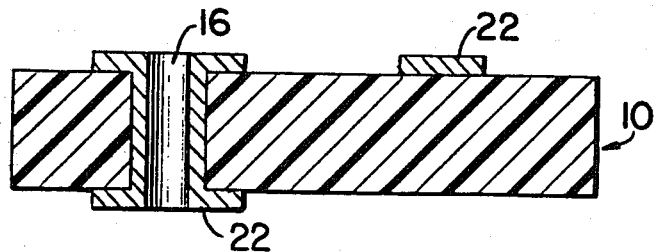
Figure 2E:
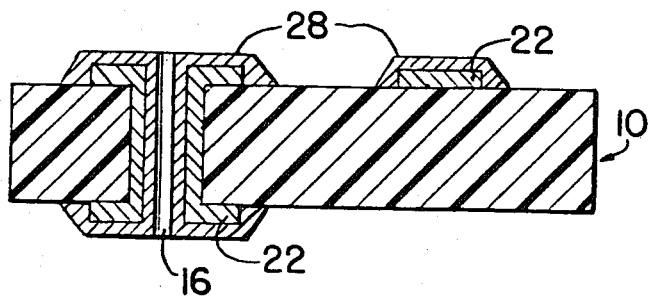

In FIG. 2B, a hole 16 is drilled in the blank. Prior to the drilling of the hole and again after the hole is drilled, the blank is exposed to microwave radiation at a frequency above about 1960 MHz for a time period of about 1 to 25 minutes, depending on the mass of the blank and the frequency of radiation, to stress relieve the sulfone polymer blank essentially without heat generation, causing distortion or flow of the sulfone polymer. The blank and walls of the hole 16 are surface pretreated by solvent and by etching with a conventional low chrome acid etchant such as (on a weight basis): 55.9% of 96% $H_2SO_4$, 10.4% of 85–87% $H_3PO_4$, 3% of $CrO_3$ and 30.7% of $H_2O$, to prepare the surface of the blank 10 and the walls of the hole 16 chemically and physically. The blank 10 and hole 16 are then completely coated with an ultraviolet light reducible copper complex 20 and dried (FIG. 2C.). An ultraviolet light photoimage is formed by brief projection or contact printing via screen on the sensitized surface 10. The unexposed light reducible coating 20 is washed away and the image 22 is fixed by brief exposure to an electroless copper bath as shown in FIG. 2D, leaving the desired circuit pattern exposed. As shown in FIG. 2E, copper is electrolessly deposited onto the pattern and the hole 16 until a circuit 28 is built up to the desired thickness, typically about 1–5 mils in about 18–20 hours.

FIG. 3 illustrates an "electroplating" method of producing printed circuit boards. In FIG. 3A there is shown an insulating blank 10 comprised of polyethersulfone. Both prior to and after the hole is drilled, the blank is exposed to infrared radiation at a frequency between about 2.5 and 40 $\mu$m for a time period in the order of 1 minute or less depending on the mass of the polyethersulfone blank to stress relieve the blank essentially without heat generation causing distortion or flow of the polyethersulfone. As illustrated in FIG. 3B, the blank 10 is pretreated for about 3–6 minutes in a dimethyl formamide solution to promote adhesion of metal to blank 10 after an etching step. In FIG. 3C, the blank 10 is etched for about three minutes at about 35° C. to about 70° C. in a highly oxidizing solution. This changes the surface of the blank from glossy to hazy while providing sites for chemical linking of the surface of the blank 10 to metal. The etched and pretreated blank 10 is activated by immersion in a stannous and palladium solution at ambient temperature for 1–3 minutes, each, as shown in FIG. 3C. During such an immersion, palladium sites 20 are deposited over the entire blank 10, including on the walls of the holes (not shown) in the blank in order to catalyze the subsequent deposition of electroless metal.

Figure 3A:
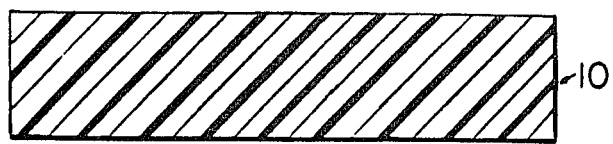
Figure 3B:
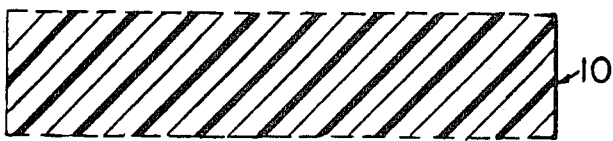
Figure 3C:
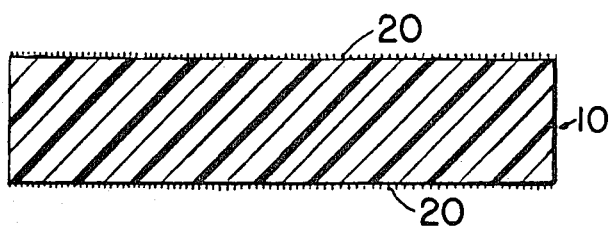
Figure 3D:
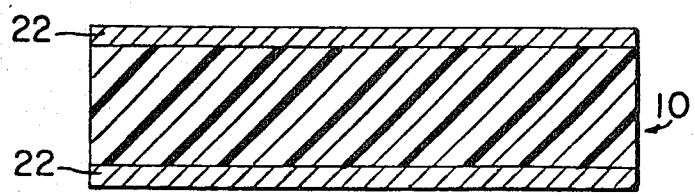
Figure 3E:
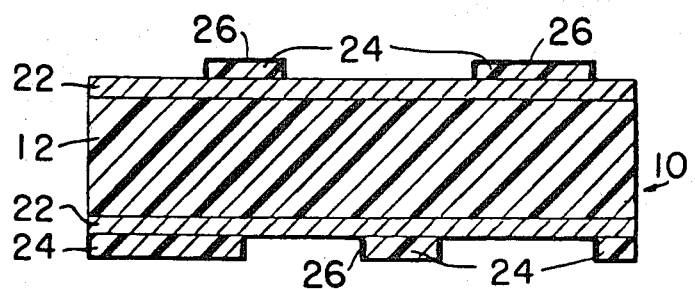
Figure 3F:
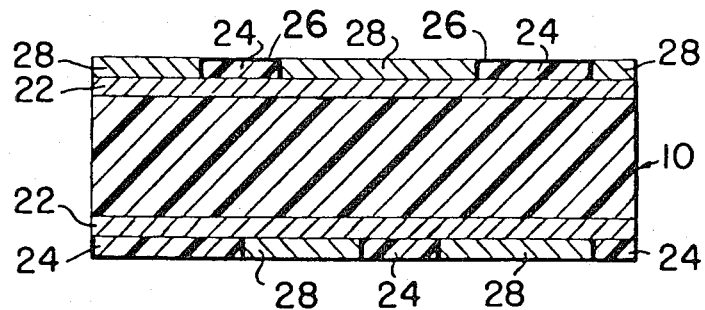
Figure 3G:
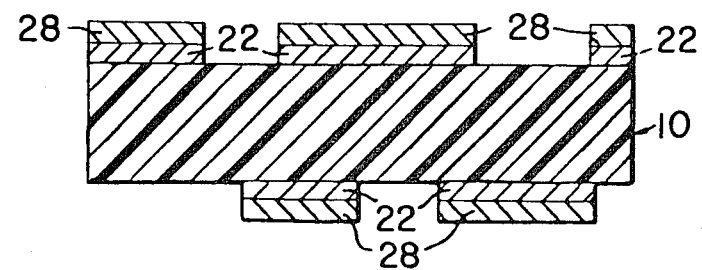

A layer of electroless metal 22 is deposited in the activated surface and in the holes (not shown) of the blank 10, typically at ambient temperature for about 30 minutes in order to render the surface of the blank electrically conductive (as shown in FIG. 3D). In FIG. 3E, a desired circuit is imprinted by a photoresist technique onto the metal coated blank 10. A photo-sensitive coating 24 is applied to the surface of the blank. The photosensitive coating 24 may polymerize or depolymerize on exposure to ultraviolet light. A mask 26 is then used to form a background resist which in turn outlines a circuit pattern on the surface of the blank 10 (as shown in FIG. 3E). In FIG. 3F, copper 28 is electroplated onto the pattern to a desired thickness such as 25–70 $\mu$m. In FIG. 3G, the background resist is stripped and the conductive background film of copper removed by etching.

The following examples illustrate at least one of the best modes of the insulating blanks, printed circuit boards and methods of the present invention as presently understood.

EXAMPLE 1

Extruded polysulfone sheets having thickness of 775 microns and 1550 microns respectively were used to make blanks.

The extruded sheets where processed into a printed circuit board employing the following steps: (1) each extruded sheet was exposed to microwave frequencies at 2450 MHz for 1 to 2 minutes respectively, in a microwave oven (Model JET 85, 2450 MHz, 625 watts (FR), 115 VAC, 60 Hz, 1.25 Kw, commercially available from General Electric Co.); (2) through holes were drilled in each extruded sheet; (3) each extruded sheet was brushed to remove drilling debris; (4) each extruded sheet was exposed to microwave frequencies at 2450 MHz for 1 and 2 minutes respectively, in a microwave oven (Model JET 85, 2450 MHz, 625 watts (FR), 115 VAC, 60 Hz, 1.25 Kw, commercially available from General Electric Co.); (5) each extruded sheet was immersed in dimethyl formamide-water solution (specific gravity of 0.955–0.965) for 3–6 minutes; (6) each extruded sheet was rinsed in hot water for 45 seconds; (7) the surface of each extruded sheet was adhesion promoted at a temperature of 55° C. for a time period of 7 minutes with the following solution: $CrO_3$-20 g/l, $H_3PO_4$-100 ml/1, $H_2SO_4$-600 ml/1, and 0.5 g/l of an anionic perfluoroalkyl sulfonate; (8) the extruded sheet was rinsed in still water; (9) Cr[VI] was neutralized with a solution containing 15% $H_2O_2$ and 10% $H_2SO_4$; (10–12) the extruded sheet was rinsed with water, immersed successively in 2.5 M HCl a seeder solution (the seeder solution described in example 1 of U.S. Pat. No. 3,961,109, incorporated herein by reference) and an accelerator, 5% $HBF_4$; (13) copper was electrolessly deposited onto the extruded sheet (electroless copper solution is described previously herein) to a thickness of 2.5 microns; (14–15) the copper clad extruded sheet was rinsed with water and dried at 125° C. for 10 minutes providing a copper clad extruded sheet (as shown in FIG. 3D).

Printed circuit boards were manufactured using such copper clad extruded sheets by techniques well known in the art, i.e., a background resist image was printed, a copper circuit pattern was electroplated using the copper bath described previously herein, the resist was stripped and the background copper was etched away (See FIGS. 3E–3G).

Peel strengths of 1.7 N/mm were measured for the printed circuit board. A solder float test was also employed. A one-inch square copper pattern (the printed circuit board) produced according to this example was floated on 245° C. molten solder for 5 seconds. The sample was removed for examination of potential blisters and/or delamination of the copper pattern (from the blank). No blistering or delamination was detected.

EXAMPLE 2

An epoxy glass laminate (commercially available under the gradename G10 FR from Norplex Division of UOP, Inc., LaCross, Wisconsin), was clad with 35 um thick copper foil top and bottom. A copper circuit was etched in the foil by laminating with Riston 1206 (0.6 mil thick dry film photopolymer commercially available from E. I. DuPont deNemours & Co., Wilmington, Del.), exposing to ultraviolet light through a negative, developing out the unexposed Riston 1206 with 1,1,1,-trichloroethane, etching the copper with ammoniacal cupric chloride removing the remaining Riston 1206 with methylene chloride.

A polysulfone adhesive was prepared by dissolving pellets of polysulfone resin (commercially available under the tradename Udel P1700 NT from Union Carbide Corporation, 270 Park Avenue, New York, N.Y. 10017) in methylene chloride. The etched panel was dipped in the polysulfone solution and air dried. A 75 $\mu$m thick polysulfone foil was laminated to the adhesive coated double sided panel in a press at 175° C. for 10 minutes at 200 p.s.i. (1.4 MPa).

Through holes were drilled in the panel and the debris was removed by brushing. Prior to and after the holes were made, the blanks were stress relieved by exposure to infrared radiation at a frequency in the 2.5 to 40 μm region for a time period of 35 seconds in an infrared fusing oven (Model 4384 commercially available from Research Incorporated, Minneapolis, Minn.). The panel was processed into multi-layer printed circuit board following the procedure of example 1 except that the adhesion promotion time was only two minutes.

EXAMPLE 3

A copper clad polysulfone sheet clad with 35 mm thick copper foil top and bottom was annealed for 4 hours at 170° C. while fixtured between steel plates to maintain flatness and prevent warping. Copper circuit patterns were etched in the top and bottom foils as in example 2. A polysulfone adhesive was prepared as in example 2 and applied to surface provided with the circuit pattern and air dried. Two polysulfone foils 75 mm thick and optionally exposed to microwave frequencies as in example 1 to relieve stress were laminated top and bottom over the etched copper foil patterns in a press at 175° C. for 10 minutes at 1.4 MPa.

Holes were drilled in the panel and the debris removed by brushing. After the holes were made, the blanks were stress relieved again by exposure to infrared radiation as in example 2. (Ultraviolet radiation also could have been used.) It was then converted into a polysulfone multi-layer circuit board by following the procedure of example 1.

EXAMPLE 4

An extruded sheet of a polyetheretherketone (PEEK, commercially available from ICI (America), Inc.) 1 mm thick was procesed as follows: (1) two mounting holes were drilled to provide means for holding the sheet during processing; (2) the extruded sheet was exposed to microwave frequency at 2450 MHz for 1 minute in a microwave oven: (3) the extruded sheet was soaked in a dimethyl formamide—water solution (specific gravity of 0.955–0.965) for 3–6 minutes; (4) the extruded sheet was immersed in a hot aqueous solution of 0.1% of an anionic surfactant, a nonyl phenyl polyethoxyphosphate (Gafac RE-610 available from GAF Corp., Chemical Products, 140 West 51st Street, New York, N.Y., 10020), at 35°–45° C., for 45–60 seconds; (5) the extruded sheet was immersed in an aqueous solution of phosphoric acid 100 ml/l, sulfuric acid 600 ml/l and 0.05% of an anionic perfluoroalkyl sulfonate at 55° C. for 5 minutes; (6) the extruded sheet was adhesion promoted at a temperature of 70° C. in a high chrome solution of $CrO_3$–400 g/l, $H_2SO_4$–250 ml/l and $H_3PO_4$–50 ml/l and 0.5 g/l of an anionic perfluoroalkyl sulfonate; (7) the extruded sheet was rinsed in still water; (8) chromium (VI) on the surface of the sheet was neutralized by immersing the extruded sheet in a solution of 40 ml of 35% hydrogen peroxide and 10 ml of 96% sulfuric acid; (9) the extruded sheet was rinsed in water; (10) the extruded sheet was immersed in an alkaline cleaner (Altrex, commercially available from BASF-Wyandotte, Wyandotte, Mich.); (11) the extruded sheet was again rinsed in water; (12–14) the extruded sheet was immersed, successively, in a stannous chloride-sodium chloride pre dip solution; a stannous chloride-palladium chloride activator solution (Adion 660, commercially available from Chemline Ind. Carson City, Nev.); a water rinse and an accelerator, 5% fluoroboric acid; (15) copper was electrolessly deposited onto the extruded sheet in an electroless copper bath (described previously herein to a thickness of 2.5 microns; (16–17) the copper clad sheet was rinsed with water and dried at 125° C. for 10 minutes providing a copper clad extruded sheet (as shown in FIG. 3D.)

The copper clad extruded sheet was electroplated in a copper sulfate plating bath to a thickness of 35 microns. Peel strength of 2.6 N/mm were measured. After a solder float test of 288° C. for 20 seconds, no blistering or delamination was observed. In both these tests the polyetheretherketone had improved results compared to the extruded polysulfone blank of example 1.

EXAMPLE 5

The producedure of example 4 was repeated substituting a 1.6 mm thick extruded sheet of polyetherimide (ULTEM, commercially available from General Electric Co.) in lieu of the 1 mm thick sheet of polyetheretherketone. The peel strength of the copper from the polyetherimide was 1 N/mm. The sample withstood a solder float test of 260° C. for 10 seconds.

EXAMPLE 6

Molded blanks were prepared of polyetherimide resin. The molding resin contained 0.12% titanium dioxide pigment to render the blanks opaque. Some of the blanks were molded with 10% glass fiber filter and some with 10% glass fiber filler plus mineral filler for reinforcement. The molded blanks were processed by the procedure of Example 4, steps 2 to 11. A non-noble metal printed circuit image was produced on the blanks by the procedure of Polichette et al, U.S. Pat. No. 3,994,727 (Ex. 11) and plated to a copper thickness of 35 microns in an electroless copper plating solution. The blanks were dried after electroless plating for 1 hour at 160° C. Peel strengths were found to be:

| Molding Compound | Peel Strength |
|---|---|
| Polyetherimide + 0.12% $TiO_2$ | 1.75 N/mm |
| Polyetherimide + 0.12% $TiO_2$ + 10% glass fiber | 1.4 N/mm |
| Polyetherimide + 0.12% $TiO_2$ + 10% glass fiber & mineral filler | 1.2 N/mm |

EXAMPLE 7

A printed circuit was prepared by the semi-additive technique on extruded sheet of polyetherimide. The blank was cut from the extruded sheet and stress relieved with microwave radiation; and drilled with the through hole pattern. The blank was then processed by the procedure of example 4, steps 2 through 16. The blank was then imaged, electroplated with copper; and the image and unwanted copper subsequently removed by well known techniques leaving a copper printed circuit with plated through holes. The bond peel strength of the copper conductor to the base was 1 N/mm.

What is claimed is:

1. A method of stress relieving a polymer article which method comprises exposing said article to electromagnetic radiation selected from the group consisting of microwave, infrared and ultraviolet at one or more ranges of frequencies which are capable of being absorbed by said article and which are effective for stress relieving essentially without causing heat induced softening or flowing of said polymer, for a time period sufficient to absorb enough energy to stress relieve and/or stabilize said polymer against stress cracking therein.

2. A method of stress relieving an extruded or molded article comprised of a high temperature thermoplastic polymer having an aromatic backbone that does not liquify or decompose at a temperature of about 245° C. after five seconds exposure at said temperature, which method comprises exposing said article to electromagnetic radiation selected from the group consisting of microwave, infrared or ultraviolet at one or more ranges of frequencies which are capable of being absorbed by said article and which are effective for stress relieving essentially without causing heat induced softening or flowing of said polymer, for a time period sufficient to absorb enough energy to stress relieve and/or stabilize said polymer against stress cracking therein.

3. A method of stress relieving an extruded or molded article comprised of an aromatic polyether polymer, which method comprises exposing said article to electromagnetic radiation selected from the group consisting of microwave, infrared and ultraviolet at one or more ranges of frequencies which are capable of being absorbed by said article and which are effective for stress relieving essentially without causing heat induced softening or flowing of said polymer, for a time period sufficient to absorb enough energy to stress relieve and/or stabilize said polymer against stress cracking therein.

4. A method as defined in claim 3 wherein said polymer is selected from sulfone polymers, polyetherimides or polyetheretherketones.

5. A method as defined in claim 4 wherein said polymer is a polyetherimide.

6. A method as defined in claim 4 wherein said polymer is a polyetheretherketone.

7. A method of preparing a blank for use in the preparation of a printed circuit board which method comprises:

exposing a polymer film, sheet or substrate comprised of a high temperature thermoplastic polymer having an aromatic backbone that does not liquify or decompose at a temperature of about 245° C. after five seconds exposure at said temperature, to electromagnetic radiation at one or more ranges of frequencies which are capable of being absorbed by said film, sheet or substrate and which are effective for stress relieving essentially without heat induced softening or flowing of the polymer, for a time period sufficient to absorb enough energy to stress relieve and/or stabilize the polymer against stress cracking, the radiation selected from the group consisting of microwave, infrared or ultraviolet radiation;

mechanically treating said film, sheet or substrate to produce holes therethrough;

repeating the radiation treatment step;

chemically treating said film, sheet or substrate with a polar solvent capable of swelling the outer surface of said film, sheet or substrate to promote adhesion of metal to the surface thereof after an etching step; and treating the surface of said film, sheet or substrate with a highly oxidizing solution or with a plasma at a temperature and for a time period sufficient to provide sites for chemical and/or mechanical linking of the surface to a metal layer attached thereto.

8. A method of preparing a blank for use in the preparation of a printed circuit board which method comprises:

exposing an aromatic polyether polymer film, sheet or substrate to electromagnetic radiation at one or more ranges of frequencies which are capable of being absorbed by said film, sheet or substrate and which are effective for stress relieving essentially without heat induced softening or flowing of said polymer, for a time period sufficient to absorb enough energy to stress relieve and/or stabilize the polymer against stress cracking, the radiation selected from the group consisting of microwave, infrared or ultraviolet radiation;

mechanically treating said film, sheet or substrate to produce holes therethrough;

repeating the radiation treatment step;

chemically treating said film, sheet or substrate with a polar solvent capable of swelling the outer surface of said film, sheet or substrate to promote adhesion of metal to the surface thereof after an etching step; and treating the surface of said film, sheet or substrate with a highly oxidizing solution or with a plasma at a temperature and for a time period sufficient to provide sites for chemical and/or mechanical linking of the surface to a metal layer attached thereto.

9. A method as defined in claim 8 wherein said polymer is selected from sulfone polymers, polyetherimides or polyetheretherketones.

10. A method as defined in claim 9 wherein said polymer is a polyetherimide.

11. A method as defined in claim 9 wherein said polymer is a polyetheretherketone.

12. A method of preparing a composite suitable for use in the manufacture of printed circuit boards which method comprises:

providing polymer films or sheets having substantially uniform thickness greater than about 75 microns and comprised of a high temperature thermoplastic polymer having an aromatic backbone that does not liquify or decompose at a temperature of about 245° C. after five seconds exposure at said temperature;

exposing the polymer films or sheets to electromagnetic radiation at one or more ranges of frequency which are capable of being absorbed by said films or sheets and which are effective for stress relieving essentially without heat induced softening or flowing of the polymer, for a period sufficient to absorb enough energy to stress relieve and/or stabilize the polymer against stress cracking, the radiation selected from the group consisting of microwave, infrared and ultraviolet radiation laminating the radiation treated polymer film or sheet to a sheet of reinforced thermoset material under conditions of heat and pressure;

mechanically treating the laminate by drilling one or more holes therethrough; and exposing said laminated composite to electromagnetic radiation at one or more ranges of frequencies which are capable of being absorbed by said composite and which are effective in stress relieving essentially without heat induced deformation by softening or flowing of the polymer, for a time period sufficient to absorb enough energy to stress relieve and/or stabilize said polymer against stress cracking, the radiation selected from the group consisting of microwave, infrared and ultraviolet radiation.

13. A method of preparing a composite suitable for use in the manufacture of printed circuit boards which method comprises:
provoding aromatic polyether polymer films or sheets having substantially uniform thickness greater than about 75 microns;
exposing the polymer films or sheets to electromagnetic radiation at one or more ranges of frequency which are capable of being absorbed by said films or sheets and which are effective for stress relieving essentially without heat induced softening or flowing of the polymer, for a period sufficient to absorb enough energy to stress relieve and/or stabilize the polymer against stress cracking, the radiation selected from the group consisting of microwave, infrared and ultraviolet radiation;
laminating the radiation treated polymer film or sheet to a reinforced thermoset material under conditions of heat and pressure;
mechanically treating the laminate by drilling one or more holes therethrough; and
exposing said laminated composite to electromagnetic radiation at one or more ranges of frequencies which are capable of being absorbed by said composite and which are effective in stress relieving essentially without heat induced deformation by softening or flowing of said polymer, for a time period sufficient to absorb enough energy to stress relieve and/or stabilize said polymer against stress cracking, the radiation selection from the group consisting of microwave, infrared and ultraviolet radiation.

14. A method as defined in claim 13 wherein said polymer is selected from sulfone polymers, polyetherimides or polyetheretherketones.

15. A method as defined in claim 14 wherein said polymer is a polyetherimide.

16. A method as claimed in claim 14 wherein said polymer is a polyetheretherketone.

17. A method of preparing formed articles including a blank suitable for use in the preparation of a printed circuit board which method comprises:
providing a substrate comprised of an injection molded high temperature thermoplastic polymer, said polymer substrate having one or more holes therethrough;
exposing the polymer substrate to microwave radiation at one or more ranges of frequencies which are capable of being absorbed by the polymer substrate and which are effective in stress relieving essentially without heat induced distortion or flow of the polymer, for a time period sufficient to absorb enough energy to relieve the polymer substrate against stress cracking; and
treating the surface of the radiation treated polymer substrate with an oxidizing media or a plasma to produce a hydrophilic surface receptive to subsequent metallization.

18. A method of preparing formed article including a blank suitable for use in the preparation of a printed circuit board which method comprises:
providing an injection molded aromatic polyether polymer substrate having one or more holes therethrough;
exposing the polymer substrate to microwave radiation at one or more ranges of frequencies which are capable of being absorbed by the polymer substrate and which are effective in stress relieving essentially wihtout heat induced distortion or flow of the polymer, for a time period sufficient to absorb enough energy to relieve the polymer substrate against stress cracking; and
treating the surface of the radiation treated polymer substrate with an oxidizing media or a plasma to produce a hydrophilic surface receptive to subsequent metallization.

19. A method as defined in claim 18 wherein said polymer is selected from sulfone polymers, polyetherimides or polyetheretherketones.

20. A method as defined in claim 19 wherein said polymer is a polyetherimide.

21. A method as defined in claim 19 wherein said polymer is a polyetheretherketone.

22. A method of preparing a multi-layered printed circuit board, which method comprises the steps of:
providing a substrate having a circuit pattern on at least one surface thereof;
laminating a high temperature theromplastic polymer said polymer having a thickness greater than 75 microns to the metal clad substrate;
mechanically treating the metal clad laminate by drilling one or more holes therethrough;
exposing said polymer to infrared or ultraviolet radiation at one or more ranges of frequencies which are capable of being absorbed by the polymer film or sheet and which are effective for stress relieving essentially without heat induced deformation by softening or flowing of the polymer, for a time period sufficient to stress relieve and/or stabilize the polymer film or sheet against stress cracking;
chemically treating the polymer surface with a solvent and oxidizing agent ot render said surface microporous and hydrophilic;
repeating the radiation treatment step with infrared or ultraviolet radiation for a time period sufficient to stabilize the polymer against stress cracking; and
electrolessly depositing a metal onto the treated surface.

23. A method of preparing a multi-layered printed circuit board, which method comprises the steps of:
providing a substrate having a circuit pattern on at least one surface thereof;
laminating an aromatic polyether polymer having a thickness greater than 75 microns to the metal clad substrate;
mechanically treating the metal clad laminate by drilling one or more holes therethrough;
exposing said polymer to infrared radiation at one or more ranges of frequencies which are capable of being absorbed by the polymer film or sheet and which are effective for stress relieving essentially without heat induced deformation by softening or flowing of the polymer, for a time period sufficient to stress relieve and/or stabilize the polymer film or sheet against stress cracking;
chemically treating the polymer surface with a solvent and oxidizing agent to render said surface microporous and hydrophilic; and
electrolessly depositing a metal onto the treated surface.

24. A method as defined in claim 23 wherein said polymer is selected from sulfone polymers, polyetherimides or polyetheretherketones.

25. A method as defined in claim 24 wherein said polymer is a polyetherimide.

26. A method as defined in claim 24 wherein said polymer is a polyetheretherketone.

27. A method as defined in claims 3, 8, 13 or 23 wherein said radiation is infrared at wavelength between about 2.5 and about 40 micrometers for a time period less than one minute.

28. A method as defined in claims 3, 8, 13, 18 or 23 wherein said radiation is microwave at a frequence about 1960 MegaHertz.

29. A method as defined in claims 3, 8 or 13 wherein said radiation is ultraviolet at a wavelength between 0.23 and 0.28 micrometers.

30. A method of plating a polymer article comprised of a high temperature thermoplastic polymer having an aromatic backbone that does not liquify or decompose at a temperature of about 245° C. after five seconds exposure at said temperature, which method comprises:
exposing said polymer to article electromagnetic radiation at one or more ranges of frequencies which are capable of being absorbed by said article and which are effective for stress relieving essentially without heat induced deformation by softening or flowing of the polymer, for a time period sufficient to absorb enough energy to stress relieve and/or stabilize the article against stress cracking, said radiation selected from the group consisting of microwave, infrared and ultraviolet;
chemically treating said polymer article with a polar solvent capable of swelling the outer surface of said article to promote adhesion of metal etched to the surface thereof after an etching step;
etching the surface of said article in a highly oxidizing solution at a temperature and for a time period sufficient to provide sites for chemical linking of the surface to the metal; and
electrolessly depositing a metal film layer on at least part of the surface of said article.

31. A method of plating an aromatic polyether polymer article which method comprises:
exposing said polymer article to electromagnetic radiation at one or more ranges of frequencies which are capable of being absorbed by said article and which are effective for stress relieving essentially without heat induced deformation by softening or flowing of the polymer, for a time period sufficient to absorb enough energy to stress relieve and/or stabilize the article against stress cracking, said radiation selected from the group consisting of microwave, infrared and ultraviolet;
chemically treating an aromatic polyether article with a polar solvent capable of swelling the outer surface of said article to promote adhesion of metal etched to the surface thereof after an etching step;
etching the surface of said article in a highly oxidizing solution at a temperature and for a time period sufficient to provide sites for chemical linking of the surface to the metal; and
electrolessly depositing a metal film layer on at least part of the surface of said article.

32. A method as defined in claim 31 wherein said polymer is selected from sulfone polymers, polyetherimides or polyetheretherketones.

33. A method as defined in claim 32 wherein said polymer is a polyetherimide.

34. A method as defined in claim 32 wherein said polymer is a polyetheretherketone.

* * * * *